United States Patent
Peron et al.

(10) Patent No.: US 12,279,361 B2
(45) Date of Patent: Apr. 15, 2025

(54) ASSEMBLY COMPRISING A CIRCUIT CARRIER AND A HEAT SINK

(71) Applicant: Hella GmbH & Co. KGaA, Lippstadt (DE)

(72) Inventors: Christopher Peron, Pins-Justaret (FR); Clement Tondellier, Toulouse (FR)

(73) Assignee: Hella GmbH & Co. KGaA, Lippstadt (DE)

( * ) Notice: Subject to any disclaimer, the term of this patent is extended or adjusted under 35 U.S.C. 154(b) by 249 days.

(21) Appl. No.: 17/655,033

(22) Filed: Mar. 16, 2022

(65) Prior Publication Data

US 2022/0210908 A1 Jun. 30, 2022

Related U.S. Application Data

(63) Continuation of application No. PCT/EP2019/077157, filed on Oct. 8, 2019.

(51) Int. Cl.
*H05K 1/02* (2006.01)

(52) U.S. Cl.
CPC ......... *H05K 1/0209* (2013.01); *H05K 1/0278* (2013.01); *H05K 2201/066* (2013.01); *H05K 2201/09018* (2013.01)

(58) Field of Classification Search
CPC .............................. H05K 1/0209; H05K 1/021
See application file for complete search history.

(56) References Cited

U.S. PATENT DOCUMENTS

| | | | | |
|---|---|---|---|---|
| 5,172,755 A | * | 12/1992 | Samarov | H05K 3/0061 165/185 |
| 9,041,196 B2 | * | 5/2015 | Bayerer | H05K 1/141 257/E23.083 |
| 10,794,639 B2 | * | 10/2020 | Fushimi | H01L 23/3672 |
| 2006/0091529 A1 | | 5/2006 | Wehrly, Jr. | |
| 2009/0323342 A1 | | 12/2009 | Liu | |
| 2011/0176297 A1 | | 7/2011 | Hsia | |
| 2014/0063794 A1 | | 3/2014 | Parekh | |
| 2014/0264393 A1 | | 9/2014 | McCanless | |
| 2019/0150269 A1 | | 5/2019 | Klenk | |

OTHER PUBLICATIONS

WO 2017032576 AI; Bagung et al image and machine translation (Year: 2017).*

* cited by examiner

*Primary Examiner* — Jeremy C Norris
(74) *Attorney, Agent, or Firm* — Husch Blackwell LLP

(57) ABSTRACT

An arrangement is provided comprising a circuit carrier and a heat sink. The circuit carrier has at least one arc-shaped curved region, and the heat sink also has at least one arc-shaped curved region. The arc-shaped curved region of the circuit carrier is either inwardly or outwardly curved, and the arc-shaped curved region of the heat sink is the opposite either outwardly or inwardly curved. The contour of the arc-shaped curved region of the circuit carrier corresponds to the contour of the arc-shaped curved region of the heat sink. The curved region of the heat sink and the curved region of the circuit carrier are connected to one another.

10 Claims, 1 Drawing Sheet

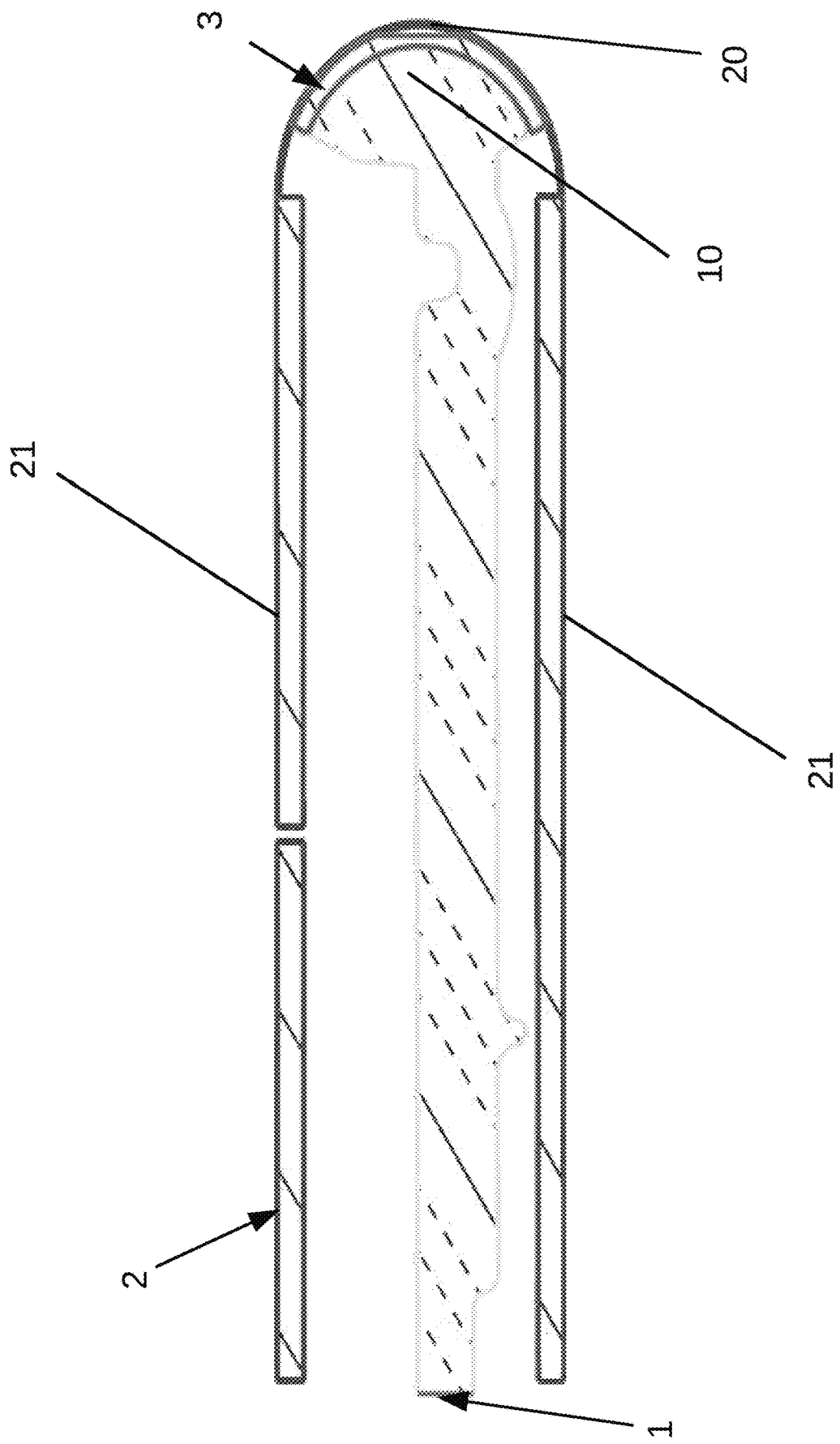

ASSEMBLY COMPRISING A CIRCUIT CARRIER AND A HEAT SINK

CROSS-REFERENCE TO RELATED APPLICATIONS

This application claims priority to and is a bypass continuation of PCT Application No. PCT/EP2019/077157, filed on Oct. 8, 2019, the entirety of which is hereby incorporated by reference.

FIELD OF THE INVENTION

The invention concerns an assembly of a circuit carrier and a heat sink, the circuit carrier having at least one arc-shaped curved region.

BACKGROUND

An electronic assembly is known from document US 2019/0150269 A1 which has a circuit carrier which is bent several times. Curved regions are arranged between flat regions of the circuit carrier on which electronic components are arranged. These convex areas make it possible for several of the flat areas of the circuit carrier to be arranged parallel to each other. Conductor tracks can be routed over the curved regions to connect components in different planar areas of the circuit carrier.

The circuit carrier is initially flat and is not bent until the assembly is manufactured in the later curved areas. In order to facilitate bending, circuit carriers are thinner in the curved regions than the flat regions of the circuit carrier. As a result, there is less mass in the curved regions that can absorb heat. There are no components in the convex areas that dissipate heat and from which heat must be dissipated. However, the resistance of the conductive tracks over the curved regions leads to a considerable heat input into the curved regions of the circuit carrier, especially at high currents. This high heat input could damage the curved region of the circuit carrier or the conductive tracks running over it. However, the heat could also be transported via the conductive tracks to the flat areas adjacent to the curved area, which could damage or destroy the electronic components located there. Because of these dangers, it is not possible to conduct high currents over the curved regions. The modules known from document US 2019/0150269 A1 are therefore not suitable for high performances.

BRIEF SUMMARY OF THE INVENTION

This is where this invention comes in.

The present invention is based on the problem of proposing an assembly consisting of a circuit carrier and a heat sink that is suitable for power electronic applications.

According to the invention, this problem is solved by the fact that the heat sink also has at least one curved area, where the arc-shaped curved region of the circuit carrier is curved inwards and the arc-shaped curved region of the heat sink is curved outwards and the contour of the arc-shaped curved inwards region of the circuit carrier corresponds to the contour of the arc-shaped curved outwards region of the heat sink and/or the arc-shaped curved region of the circuit carrier is curved outwards and the arc-shaped curved region of the heat sink is curved inwards and the contour of the arc-shaped curved region of the circuit carrier corresponds to the contour of the arc-shaped curved region of the heat sink.

In an arrangement in accordance with the invention, the curved regions of the circuit carrier and the heat sink are connected to each other. If necessary, the connection can be made via a thermally conductive intermediate layer, e.g. a heat pad or a heat-conducting paste. The outwardly curved region and the inwardly curved region can also be connected to each other directly, i.e. without a thermally conductive intermediate layer. The connection is not made via adjacent flat regions of the circuit carrier. The heat can be dissipated from the curved region of the circuit carrier into the heat sink without passing it through the regions adjacent to the curved region of the circuit carrier. There is no heat input into components arranged in the adjacent areas.

A particularly good connection between the outwardly curved region and the inwardly curved region is possible if the outwardly curved region is curved to the same extent as the inwardly curved region and vice versa.

It is possible that the outwardly curved region is curved with a first radius around an axis and the inwardly curved region is curved with a second radius around the same axis. The second radius may be equal to or slightly larger than the first radius.

The heat sink may be located between two planar areas of the carrier. The circuit carrier preferably has a distance to the planar regions of the circuit carrier. However, it is also possible that the planar regions of the circuit carrier and the heat sink are directly connected to each other or indirectly connected to each other. An indirect connection is a connection that is not routed over the curved region of the circuit carrier. An arrangement in accordance with the invention may, in particular for an indirect connection, have at least one connecting element via which the heat sink and the circuit carrier are connected to one another beyond the curved regions. The connecting element is monolithically connected to the heat sink.

An assembly conforming to the invention is part of an electronic unit conforming to the invention. This unit also has conductor tracks which are arranged in the curved region of the circuit carrier.

In addition, the unit may have components located on at least one side of the carrier. A heat conductive connection may exist between at least one of the components and the heat sink. It is also possible for the assembly to have at least one further heat sink which is in a heat-conducting connection with one or more components.

An arrangement in accordance with the invention consisting of a circuit carrier and a heat sink can be produced by the fact that in the case of a heat sink with an outwardly curved region the circuit carrier with the later curved region, if necessary with the interposition of a heat-conducting pad or heat-conducting paste, is applied to the outwardly curved region of the heat sink and bent over the outwardly curved region of the heat sink and/or in the case of a heat sink with an inwardly curved area, the circuit carrier with the later curved area is first bent and then, if necessary, pressed against the inwardly curved area of the heat sink with the interposition of a heat-conducting pad or heat-conducting paste and with the aid of a stamp.

The heat sink can thus be used as a die for bending the curved area of the circuit carrier.

BRIEF DESCRIPTION OF THE DRAWINGS

Reference is now made more particularly to the drawings, which illustrate the best presently known mode of carrying out the invention and wherein similar reference characters indicate the same parts throughout the views:

FIG. 1 is a section through an arrangement according to the invention.

DETAILED DESCRIPTION OF THE DRAWINGS

The inventional arrangement shown in FIG. 1 shows a heat sink 1, a circuit carrier 2 and a thermally conductive intermediate layer 3. The thermally conductive intermediate layer is provided between the circuit carrier 2 and the heat sink.

Heat sink 1 can be an aluminium part, in particular an aluminium die-cast part, which is processed by cutting. Heat sink 1 has a region 10 which is curved outwards about an axis with a first radius and whose surface area corresponds to that of a half cylinder.

The thermally conductive intermediate layer 3 is applied to the outwardly curved area 10 of heat sink 1.

The circuit carrier 2, which is initially in the form of a plate, is bent over the outwardly curved region 10 of heat sink 1 and the intermediate layer 3 applied to it. This results in an inwardly curved region 20 which rests on the thermally conductive intermediate layer 3. In order to make it possible to bend the circuit carrier 2, the curved region 20 is thinner than the adjacent flat regions 21 of the circuit carrier 2.

Via the thermally conductive intermediate layer 3, the inwardly curved region 20 of the circuit carrier 2 and the outwardly curved region 10 of the heat sink 1 are thermally conductively connected.

Conductor tracks (not represented) are provided in the curved region 20 of the circuit carrier with which components which can be arranged on an upper of the two planar regions 21 and components which can be arranged on a lower of the two planar regions 21 connect to one another. The tracks as well as the curved area 21 of the circuit carrier are comparatively thin and have only a low mass and thus only a low heat capacity. At the same time, large currents are to be transferred via the conductor paths, which, due to the resistance of the conductor paths, generate a large amount of heat that could not be dissipated sufficiently quickly by the curved region 21 of the circuit carrier. However, since the curved area 21 is thermally conductively connected to the heat sink 1, it is possible to dissipate the large amounts of heat without damaging the circuit carrier, the tracks or components on the circuit carrier.

REFERENCE SIGN LIST 1 heat sink
10 curved region of the heat sink
2 circuit carriers
20 curved region of the circuit carrier
21 planar region of the circuit carrier
3 thermally conductive intermediate layer

What is claimed is:

1. An assembly comprising:
   a circuit carrier having at least one first arc-shaped curved region and at least one flat region, the first arc-shaped curved region being thinner than the flat region; and
   a heat sink having at least one second arc-shaped curved region,
   wherein the first arc-shaped curved region is inwardly curved with a first radius about an axis and the second arc-shaped curved region is outwardly curved with a second radius about the same axis,
   wherein a contour of the first arc-shaped curved region corresponds to a contour of the second arc-shaped curved region, and
   wherein the second arc-shaped curved region and the first arc-shaped curved region are connected to one another.

2. An electronic unit having an assembly in accordance with claim 1, wherein the electronic unit comprises conductor tracks which are arranged in the first arc-shaped curved region.

3. The electronic unit according to claim 2, further including components which are arranged on at least one side of the circuit carrier.

4. The electronic unit according to claim 3, further including there is a heat-conducting connection between at least one of the components and the heat sink.

5. A method for producing an assembly from a circuit carrier and a heat sink according to claim 1, the method comprising the steps of:
   applying a circuit carrier having an inwardly curving first arc-shaped curved region to an outwardly curved region of a heat sink having an outwardly curving second arc-shaped curved region and bent over the outwardly curved region of the heat sink; or
   bending a circuit carrier having an outwardly curving first arc-shaped curved region, and then pressing the circuit carrier to an inwardly curved region of a heat sink having an inwardly curving second arc-shaped curved region with the aid of a stamp.

6. An assembly comprising:
   a circuit carrier having at least one first arc-shaped curved region and at least one flat region, the first arc-shaped curved region being thinner than the flat region; and
   a heat sink having at least one second arc-shaped curved region,
   wherein at least one of:
   the first arc-shaped curved region is inwardly curved and the second arc-shaped curved region is outwardly curved, such that a contour of the first arc-shaped curved region corresponds to a contour of the second arc-shaped curved region; and
   the first arc-shaped curved region is outwardly curved and the second arc-shaped curved region is inwardly curved, such that a contour of the first arc-shaped curved region corresponds to a contour of the second arc-shaped curved region,
   wherein the second arc-shaped curved region and the first arc-shaped curved region are connected to one another, and
   wherein the second radius is at least as large as the first radius.

7. An assembly comprising:
   a circuit carrier having at least one first arc-shaped curved region and at least one flat region, the first arc-shaped curved region being thinner than the flat region; and
   a heat sink having at least one second arc-shaped curved region,
   wherein the first arc-shaped curved region is inwardly curved and the second arc-shaped curved region is outwardly curved, such that a contour of the first arc-shaped curved region corresponds to a contour of the second arc-shaped curved region,
   wherein the second arc-shaped curved region and the first arc-shaped curved region are connected to one another via a heat-conducting paste or a heat-conducting pad as a thermally conductive intermediate layer.

8. An assembly comprising:
   a circuit carrier having at least one first arc-shaped curved region and at least one flat region, the first arc-shaped curved region being thinner than the flat region; and a heat sink having at least one second arc-shaped curved region, wherein the first arc-shaped curved region is inwardly curved and the second arc-shaped curved region is outwardly curved, such that a contour of the first arc-shaped curved region corresponds to a contour of the second arc-shaped curved region, wherein the second arc-shaped curved region and the first arc-shaped curved region are directly connected to each other.

9. An assembly comprising:

a circuit carrier having at least one first arc-shaped curved region and at least one flat region, the first arc-shaped curved region being thinner than the flat region; and a heat sink having at least one second arc-shaped curved region, wherein at least one of:

the first arc-shaped curved region is inwardly curved and the second arc-shaped curved region is outwardly curved, such that a contour of the first arc-shaped curved region corresponds to a contour of the second arc-shaped curved region; and the first arc-shaped curved region is outwardly curved and the second arc-shaped curved region is inwardly curved, such that a contour of the first arc-shaped curved region corresponds to a contour of the second arc-shaped curved region, wherein the second arc-shaped curved region and the first arc-shaped curved region are connected to one another, and wherein the assembly further includes at least one connecting element via which the heat sink and the circuit carrier are connected to one another outside the first arc-shaped curved region and the second arc-shaped curved region.

10. The assembly according to claim 9, wherein the connecting element is monolithically connected to the heat sink.

* * * * *